US011968791B2

(12) United States Patent
Zhang et al.

(10) Patent No.: US 11,968,791 B2
(45) Date of Patent: Apr. 23, 2024

(54) SLIDABLE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventors: Zhuo Zhang, Hubei (CN); Wen Han, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/622,853

(22) PCT Filed: Dec. 21, 2021

(86) PCT No.: PCT/CN2021/140110
§ 371 (c)(1),
(2) Date: Dec. 26, 2021

(87) PCT Pub. No.: WO2023/108722
PCT Pub. Date: Jun. 22, 2023

(65) Prior Publication Data
US 2024/0040717 A1 Feb. 1, 2024

(30) Foreign Application Priority Data
Dec. 15, 2021 (CN) .......................... 202111539816.8

(51) Int. Cl.
*H05K 5/02* (2006.01)
(52) U.S. Cl.
CPC ................. *H05K 5/0217* (2013.01)

(58) Field of Classification Search
CPC ....................................................... H05K 5/00
See application file for complete search history.

(56) References Cited

U.S. PATENT DOCUMENTS

| 2010/0033435 A1* | 2/2010 | Huitema | G09F 9/301 345/173 |
|---|---|---|---|
| 2016/0374228 A1 | 12/2016 | Park et al. | |
| 2020/0103690 A1 | 4/2020 | Wu et al. | |

FOREIGN PATENT DOCUMENTS

| CN | 208044998 U | 11/2018 |
|---|---|---|
| CN | 111312096 A | 6/2020 |

(Continued)

OTHER PUBLICATIONS

Chinese Office Action issued in corresponding Chinese Patent Application No. 202111539816.8 dated Jan. 11, 2023, pp. 1-5.

(Continued)

*Primary Examiner* — Jerry Wu
(74) *Attorney, Agent, or Firm* — PV IP PC; Wei Te Chung; Zhigang Ma (57) ABSTRACT

A sliding display device includes a housing assembly and a flexible display screen. The housing assembly includes a bottom case, a first support body, a second support body, and a linkage mechanism. The linkage mechanism is configured to drive the second support body to slide out of the bottom case into an expanded state or slide into the bottom case into an unexpanded state. Part of the flexible display screen is hidden between the bottom case and the first supporting body in the unexpanded state. The flexible display screen includes a flexible display panel, a backplate, an adhesive layer, and at least a third support body. The third support body and the second support body collectively form a network structure.

13 Claims, 8 Drawing Sheets

(56) References Cited

FOREIGN PATENT DOCUMENTS

| CN | 111508372 | A | | 8/2020 | | |
|---|---|---|---|---|---|---|
| CN | 111833743 | A | * | 10/2020 | ............ | F16H 37/12 |
| CN | 112863362 | A | | 5/2021 | | |
| CN | 113098995 | A | | 7/2021 | | |
| CN | 113539094 | A | | 10/2021 | | |
| CN | 113658510 | A | | 11/2021 | | |
| WO | 2019153257 | A1 | | 8/2019 | | |
| WO | 2021020655 | A1 | | 2/2021 | | |
| WO | 2021167236 | A1 | | 8/2021 | | |

OTHER PUBLICATIONS

Chinese Decision of Rejection issued in corresponding Chinese Patent Application No. 202111539816.8 dated Apr. 23, 2023, pp. 1-10.
International Search Report in International application No. PCT/CN2021/140110, dated Aug. 25, 2022.
Written Opinion of the International Search Authority in International application No. PCT/CN2021/140110, dated Aug. 25, 2022.
Chinese Office Action issued in corresponding Chinese Patent Application No. 202111539816.8 dated Jul. 5, 2022, pp. 1-9.

\* cited by examiner

SLIDABLE DISPLAY DEVICE

BACKGROUND OF INVENTION

1. Field of Invention

The present invention relates to a technical field of displays, and more particularly to a slidable display device.

2. Related Art

With development of display technologies, traditional display devices, such as smart phones or tablet computers, are equipped with flexible display screens, which can be retracted or stretched by sliding, folding, or rolling to change the size of display devices.

Currently, traditional slidable flexible display devices achieves functions of slidably stretching and slidably retracting through combination of scroll screen module stacks and support plates of the devices, wherein the support plates of the devices include support structures composed of first support plates and second support plates. Specifically, the first support plates and the second support plates are engageable with each other to serve as support plate structures, that is, the first support plates and the second support plates have groove-shaped structures, respectively. In an unexpanded state, the second support plates are hidden in slots of the first support plates by gaps between ribs of the second support plates, so that the second support plates and the first support plates are fitted with each other to form an integral body. In an expanded (unfolded) state, the second support plates slide out of the first support plates to expand scroll screens. However, when the groove-shaped support structures are in the expanded state, as the gaps between the ribs arranged at intervals, the supportability is deteriorated, resulting in a problem of sinking in the gaps by touch control. In addition, back sides of traditional scroll screens are supported with foaming materials to provide cushioning. However, characteristics (modulus, etc.) of traditional foaming materials under high temperature and high humidity or low temperature have undergone major changes, resulting in unstable performance and affecting product life, thereby causing problems such as peeling or cracking of module stacks. Furthermore, whole scroll screen display terminals need to be maintained with pre-tension at all times. Under normal pretension, materials such as polymers are prone to irreversible plastic deformation and creep, resulting in wrinkles or creases on display surfaces.

SUMMARY OF INVENTION

An object of the present application is to provide a slidable display device to solve the problem that traditional display devices with scrolling screens are prone to damage caused by sinking in touch areas.

To achieve the above-mentioned object, the present application provides a technical solution as follows:

An embodiment of the present application provides a slidable display device, providing display modes in an unexpanded state and in an expanded state. The slidable display device includes a housing assembly comprising a bottom case, and a first support body, a second support body, and a linkage mechanism disposed on the bottom case. The second support body is connected to the linkage mechanism, and the linkage mechanism is configured to drive the second support body to slide out of the bottom case into the expanded state or slide into the bottom case into the unexpanded state. The flexible display screen supported on the first support body and the second support body, and part of the flexible display screen hidden between the bottom case and the first support body in the unexpanded state. The flexible display screen includes a flexible display panel, a backplate disposed on a side of the flexible display panel facing the housing assembly, an adhesive layer disposed on the side of the backplate facing the housing assembly, and at least a third support body disposed on a side of the adhesive layer facing the housing assembly, and at least a network structure is collectively defined by the third support body and the second support body.

Optionally, the first support body includes a plurality of slots arranged at intervals, the second support body includes a plurality of ribs arranged at intervals, and the ribs are slidably and correspondingly insertable to the slots. The third support body includes a plurality of support strips spaced apart from each other and extending in a direction different from the ribs, and the support strips at least overlap with the ribs in the expanded state such that the support strips are staggered from the ribs for formation of the network structure.

Optionally, the linkage mechanism includes an actuating assembly, a roller disposed at one end of the actuating assembly, and a screen support plate disposed under the roller. The flexible display screen is arranged around the roller, one end of the flexible display screen is fixed to the screen support plate, and the other end is fixed to an end of the first support body away from the roller, wherein the support strips move around and against the roller during a switching between the unexpanded state and the expanded state, and a first distance is defined between adjacent ones of the support strips, so that the adjacent support strips do not interfere with each other in a process of moving around and against the roller.

Optionally, the slots of the first support body define a sliding distance, and the ribs of the second support body slide the sliding distance relative to the slots, wherein the third support body defines a support range, the support strips are arranged in the support range, and a length of the support range is a sum of the sliding distance and half of a circumference of the roller.

Optionally, a first distance is defined between adjacent ones of some of the support strips, a second distance is defined between adjacent ones of some of the support strips, and the second distance is less or greater than the first distance.

Optionally, some of each of the support strips has a first strip width, some of each of the support strips has a second strip width, and the second strip width is less than or greater than the first strip width.

Optionally, the support strip is disposed at a predetermined angle with the rib and the slot, wherein the predetermined angle is between 0° and 90°.

Optionally, the third support body includes two opposite positioning strips and a plurality of support strips connected between the two positioning strips, the support strips are arranged at intervals, and the two positioning strips are arranged corresponding to edges of the flexible display panel in a longitudinal direction.

Optionally, the flexible display screen includes a plurality of the third support bodies, and the third support bodies are arranged adjacent to each other.

Optionally, the flexible display screen further includes a metal tape attached to a side of the adhesive layer adjacent to the third support body and covering the third support body, wherein the third support body is made of a rigid material, and the adhesive layer is a double-sided tape, a double-sided tape with adhesive material, or an optical adhesive.

The present application has advantageous effects as follows: the embodiment of the present application provides the slidable display device, which can achieve the display mode in the expanded state by sliding, thereby increasing a display and touch area and providing different usage patterns; alternatively, the display mode can be switched from the expanded state to the unexpanded state by sliding, so that the size of the slidable display device can be reduced for convenient carrying. In addition, based on the third support body provided between the flexible display screen and the housing assembly of the slidable display device of the present application, the network structure is created through the support strips of the third support body which are staggered from and stacked on the ribs of the second support body and the slots of the first support body. The gaps formed by the comb-like configuration of the first support body and the second support body are divided due to the network structure, thereby minimizing an unsupported area of the flexible display screen and ensuring that the flexible display screen is fully supported, so that sinking in the flexible display screen corresponding to the gaps during user's touch control will not occur, thereby preventing damage to the flexible display screen. Furthermore, the present application uses the adhesive layer in combination with the third support body to make the flexible display screen have better temperature and weather resistance. In this fashion, the performance changes in different use environments are small, the module stack has low rebound force at low temperatures, and the push and pull force of a motor for the sliding is smaller that can ensure that the attachment between the support strips of the third support body and the adhesive layer will not shift due to sliding. Through the above-mentioned structure, the slidable display device of the present application has a better display appearance and can solve the problems in traditional display devices with scrolling screens, such as sinking in a touch area, poor weather resistance, and material creep under pretension, resulting in the appearance of wrinkles or creases, thereby causing damage.

BRIEF DESCRIPTION OF DRAWINGS

In order to better illustrate the technical solutions in the embodiments or in the prior art, the following briefly introduces the accompanying drawings for describing the embodiments. Apparently, the accompanying drawings in the following description show merely some embodiments of the present invention, and a person skilled in the art may still derive other drawings from these accompanying drawings without creative efforts.

DESCRIPTION OF PREFERRED EMBODIMENTS

The following embodiments are referring to the accompanying drawings for exemplifying specific implementable embodiments of the present invention. Directional terms described by the present invention, such as upper, lower, front, back, left, right, inner, outer, side, etc., are only directions by referring to the accompanying drawings, and thus the used directional terms are used to describe and understand the present invention, but the present invention is not limited thereto.

Figure 1:
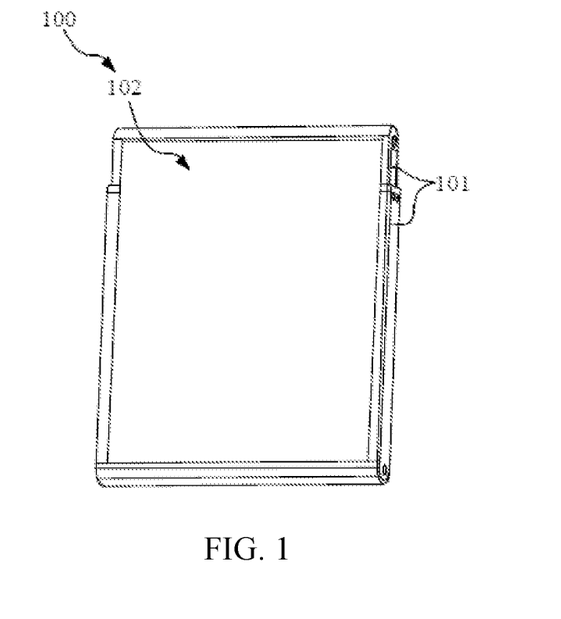
FIG. 1 is a schematic structural perspective view of a slidable display device in an unexpanded state according to an embodiment of the present application.
Figure 2:
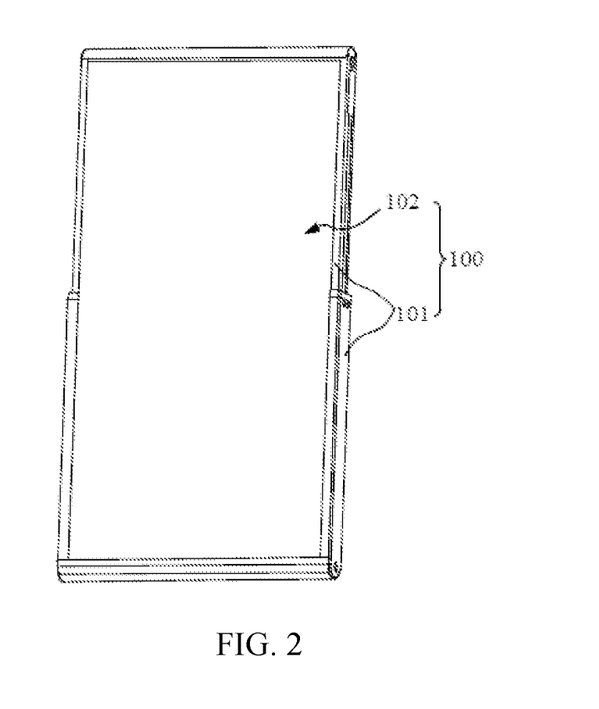
FIG. 2 is a schematic structural perspective view of the slidable display device of FIG. 1 in an expanded state.

Please refer to FIGS. 1 and 2. FIG. 1 is a schematic structural perspective view of a slidable display device in an unexpanded state according to an embodiment of the present application, FIG. 2 is a schematic structural perspective view of the slidable display device of FIG. 1 in an expanded state. As shown in FIG. 1, an embodiment of the present application provides a slidable display device 100, which is a smart mobile phone, but can also be a tablet computer, an e-book, or other electronic equipment, which is not limited in the present application. The slidable display device 100 of the present application includes a housing assembly 101 and a flexible display screen 102 assembled with the housing assembly 101. The slidable display device 100 provides display modes in an unexpanded state and in an expanded state, and the different display modes can be switched under user's control as desired. Specifically, as shown in FIG. 1, in the unexpanded state, the housing assembly 101 is not being withdrawn, and the flexible display screen 102 is in a retracted state, that is, a small-sized display state; as shown in FIG. 2, in the unexpanded state, the housing assembly 101 is withdrawn, and the flexible display screen 102 is deformed, so that the size of the flexible display screen 102 becomes larger, that is, a large-sized display state in which the flexible display screen 102 has a 180-degree flat surface.

Figure 3:
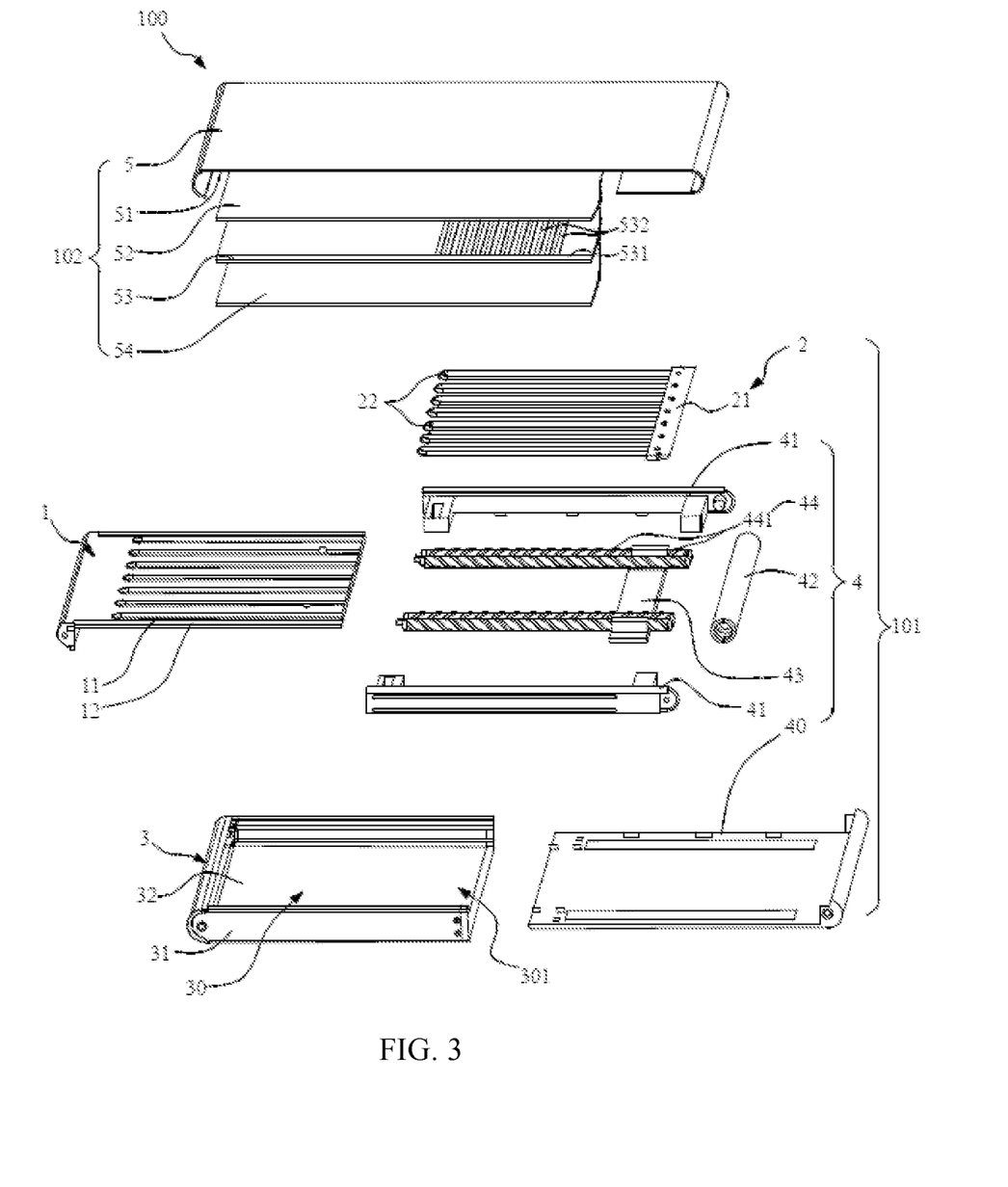
FIG. 3 is a schematic structural perspective view of a slidable display device according to an embodiment of the present application.

Referring to FIG. 3, FIG. 3 is a schematic structural perspective view of the slidable display device 100 according to an embodiment of the present application. As shown in FIG. 3, the housing assembly 101 includes a first support body 1, a second support body 2, a bottom case 3, and a linkage mechanism 4. The bottom case 3 includes a frame body 31 and a first bottom plate 32 disposed on a bottom surface of the frame body 31, and an accommodating space 30 formed between the frame body 31 and the first bottom plate 32. The accommodating space 30 defines an open end 301, and the open end 301 and a top of the accommodating space 30 are open and communicated with the outside, so that the first support body 1, the second support body 2, and the linkage mechanism 4 can be installed in the accommodating space 30. As shown in FIG. 3, one end of the first support body 1 is configured for fixing to the bottom case 3. The first support body 1 includes a plurality of slots 11 arranged at intervals and slot walls 12 disposed at two sides of each of the slot 11. In this embodiment, the slots 11 are parallel to each other, and one end of each slot 11 extends to the open end 301 of the accommodating space 30. As shown in FIG. 3, the second support body 2 includes a connecting edge 21 and a plurality of ribs 22. Specifically, the ribs 22 are spaced apart from and parallel to each other, and are arranged corresponding to the slots 11 of the first support body 1, and extend in a direction toward the slots 11, wherein one end of each of the ribs 22 is connected to the connecting edge 21. That is, the first support body 1 and the second support body 2 of the present application respectively have a comb-like configuration and can move to each other to be combined together as a whole.

Figure 4A:
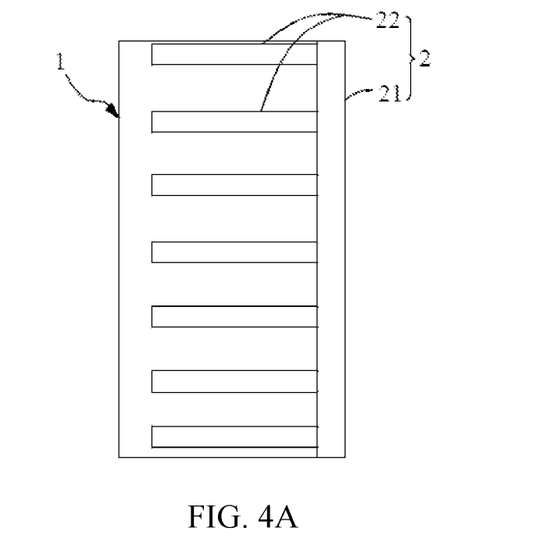
FIG. 4A is a schematic view of a second support body retracted in a first support body according to an embodiment of the present application.
Figure 4B:
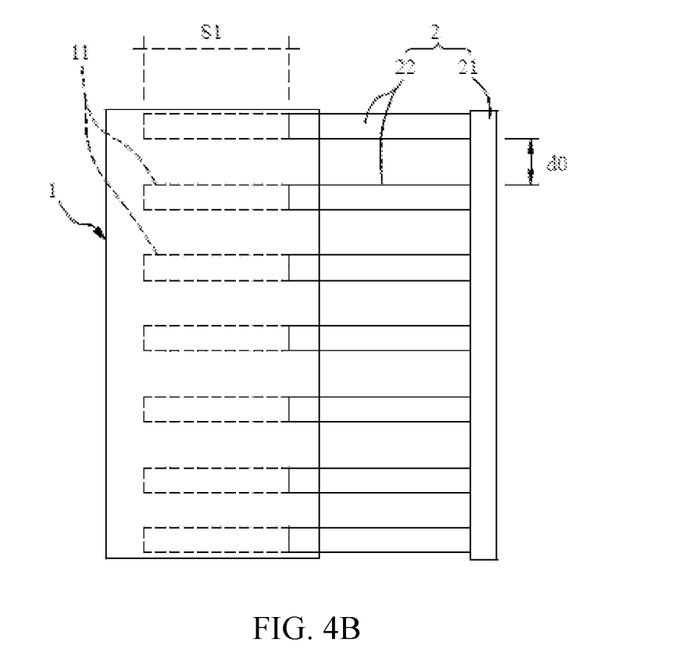
FIG. 4B is a schematize view showing the second support body of FIG. 4A slides relative to the first support body.

Please refer to FIGS. 4A and 4B. FIG. 4A is a schematic view of the second support body 2 retracted in the first support body 1 according to an embodiment of the present application. FIG. 4B is a schematic view showing the second support body 2 of FIG. 4A slides relative to the first support body 1. As shown in FIG. 4A, the ribs 22 of the second support body 2 is slidably inserted into the slots 11 of the first support body 1, respectively. As shown in FIG. 4B, the ribs 22 of the second support body 2 slidably moves in the corresponding slots 11. Specifically, the slots 11 of the first support body 1 define a sliding distance S1 (as shown in FIG. 4B), and the ribs 22 of the second support body 2 are reciprocally slidable within the sliding distance S1. In addition, in the expanded state, upper surfaces of the first support body 1 and the second support body 2 are flush with each other to maintain flatness for components above the flexible display screen 102. Specifically, there is a gap d0 between adjacent ones of the ribs 22.

Further referring to FIG. 3, the linkage mechanism 4 includes a second bottom plate 40, actuating assemblies 41 and screw rod modules 44 symmetrically arranged on both sides of the second bottom plate 40, a roller 42, and a screen support plate 43. Specifically, a bottom surface of the actuating assembly 41 is fixed to the second bottom plate 40, and one side of the actuating assembly 41 is slidably connected to an inner wall of the frame body 31; the two opposite ends of the roller 42 are connected between ends of the two actuating assembly 41; the screen support plate 43 is arranged under the roller 42 and the actuating assemblies 41. The second bottom plate 40 is configured to fix the two actuating assemblies 41 and shield internal components. In this embodiment, each of the screw rod modules 44 is rotatably connected to the actuating assembly 41 and includes two adjacent screw rods 441. A surface of each screw rod 441 has a thread structure (as shown in FIG. 3), which is meshed with a head gear (not shown) to keep linking rotation, so as to be free to rotate. It should be noted that opposite ends of one side of the screen support plate 43 are movably connected to the screw rod modules 44, respectively. Specifically, the screw rod modules 44 are configured to rotate to bring the screen support plate 43 to move back and forth on the screw rod modules 44. Particularly, the linkage mechanism 4 of the present application is slidably moving out from the open end 301, so that the display device 100 is switched to the expanded state; alternatively, the linkage mechanism 4 is slidably moving in from the open end 301, so that the display device 100 is switched to the unexpanded state (contracted state). In one embodiment, the linkage mechanism 4 can be driven by a motor (not shown) to slide out or slide into the accommodating space 30.

Figure 5:
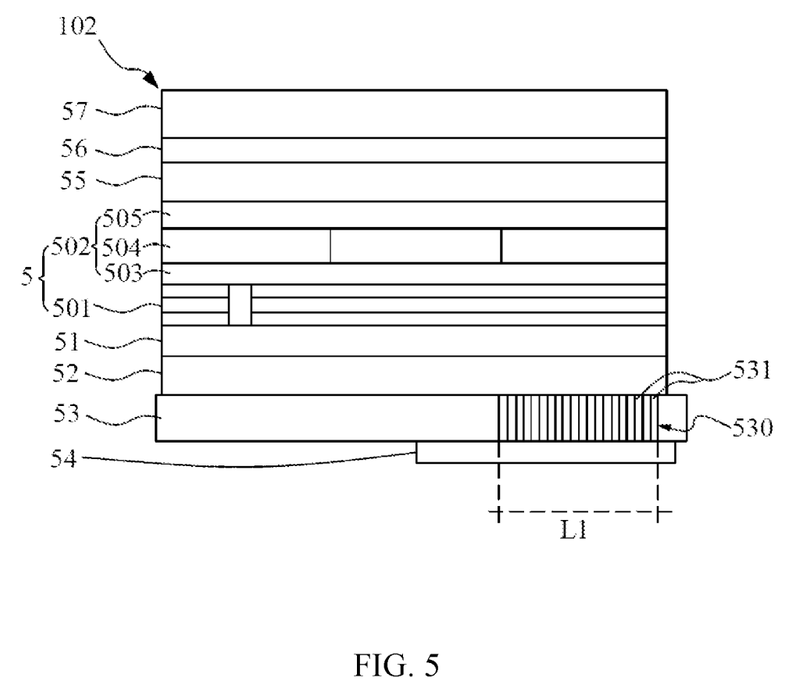
FIG. 5 is a schematic structural view of a flexible display screen according to an embodiment of the present application.

Please refer to FIG. 5 in combination with FIG. 3. FIG. 5 is a schematic structural view of the flexible display screen 102 according to an embodiment of the present application. The flexible display screen 102 of the present application is slidably installed on the housing assembly 101 and supported on the first support body 1 and the second support body 2. As shown in FIG. 5, the flexible display screen 102 includes a flexible display panel 5, and a backplate 51, an adhesive layer 52, a third support 53, and a metal tape 54 which are sequentially arranged from top to bottom on a side of the flexible display panel 5 close to the housing assembly 101. In addition, the flexible display screen 102 includes a polarizing layer 55, a pressure-sensitive adhesive layer 56, and a cover 57 arranged in order from bottom to top on a side of the flexible display panel 5 away from the backplate 51.

Please continue referring to FIG. 5. The flexible display panel 5 of the present application may be an organic light-emitting display panel with flexible characteristics including a flexible array substrate 501 and a light-emitting device 502 provided on the array substrate 501. The light-emitting device 502 may include an anode layer 503, an organic light-emitting material layer 504, and a cathode layer 505. A working principle and detailed structure of the flexible display panel 5 of the present application are the same as a working principle of a general organic light-emitting display panel, and will not be described in detail here. As shown in FIG. 5, the thin backplate 51 is disposed on the side of the flexible display panel 5 close to the housing assembly 101, and the adhesive layer 52 is disposed on a side of the backplate 51 facing the housing assembly 101. It should be noted that the adhesive layer 52 may be a double-sided tape, a double-sided tape with adhesive material, an optical adhesive, or a foam material, which is configured to buffer pressure from touch control on the flexible display 102, and may fix the third support body 53 to the flexible display panel 5.

Figure 8:
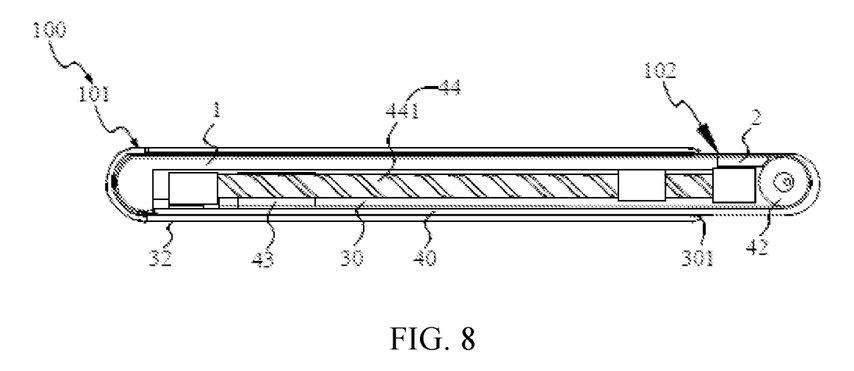
FIG. 8 is a schematic cross-sectional view of a slidable display device in the unexpanded state according to an embodiment of the present application.

Please refer to FIG. 8 first. FIG. 8 is a schematic cross-sectional view of the slidable display device 100 in the unexpanded state according to an embodiment of the present application. As shown in FIG. 8, the flexible display screen 102 is arranged around the roller 42, one end of the flexible display screen 102 is fixed to the screen support plate 43, and the other end is fixed to an end of the first support body 1 away from the roller 42. In this embodiment, the adhesive layer 52 of the present application can withstand a high temperature of at least 80° C. and a humidity of 90%. Characteristics of the adhesive layer 52 in this environment change little. Therefore, the adhesive layer 52 has high weather resistance and less requirements for the push and pull force of a motor, so that the performance of the adhesive layer 52 under different environments changes little, thereby not causing a problem of peeling or cracking of a module stack. Specifically, during movement of the flexible display screen 102 of the present application in the expanded state and the retracted state, the temperature between the flexible display screen 102, the roller 42, and the second support 2 increases due to friction of the movement. Because of the high weather resistance of the adhesive layer 52 of the present application, the problem of peeling or cracking of the module stack will not be caused, thereby ensuring the normal operation of the display device 100 of the present application in most environments. Since opposite ends of the flexible display screen 102 are fixed, respectively, part of the flexible display screen 102 is bent and hidden in the accommodating space 30 in the retracted state, and thus the flexible display screen 102 is constantly in a deformed state; that is, both ends of the flexible display screen 102 need to maintain a pretension at all times. Under normal pretension, materials such as polymers (e.g., traditional foam materials) are prone to irreversible plastic deformation and creep, resulting in wrinkles or creases on display surfaces. An adhesive force of the adhesive layer 52 of the present application is much greater than the pretension force, so that there is almost no shifting occurring under the action of the pretension force.

In addition, as shown in FIG. 5, the polarizing layer 55 is disposed on the side of the flexible display panel 5 away from the backplate 51 to prevent external light from entering an interior of the flexible display screen 102 and causing light reflection and adversely affecting a display effect. The pressure-sensitive adhesive layer 56 is coated on the side of the polarizing layer 55 away from the flexible display panel 5 and is configured to fix the transparent cover 57 on the flexible display panel 5. Specifically, the cover 57 is provided to protect the display device 100 and further prevent dust and moisture.

Please further refer to FIG. 5. The third support body 53 is disposed on a side of the adhesive layer 52 facing the housing assembly 101, and is made of copper, copper alloy, stainless steel, glass, or other rigid materials, and processed by etching or stamping. The third support body 53 is further covered by the metal tape 54. Specifically, the metal tape 54 is a stainless steel tape, which can protect and further stabilize the third support 53 and facilitate the movement of the third support 53 with the linkage mechanism 4 in the expanded state and the unexpanded state.

Figure 6:
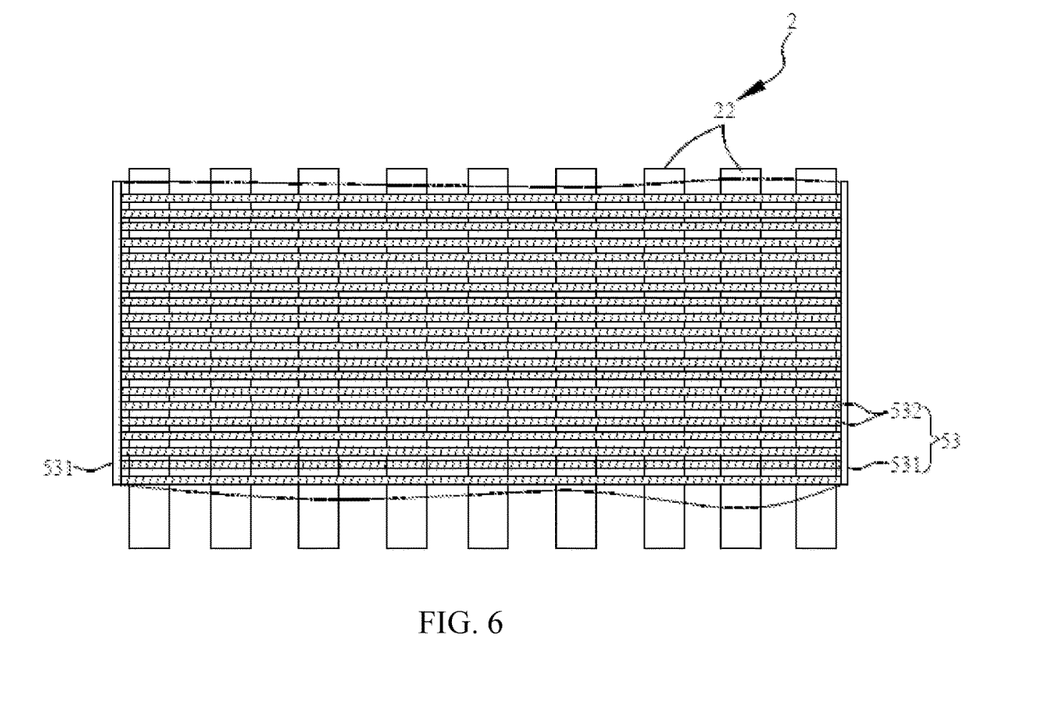
FIG. 6 is a schematic structural plan view of the second support body and a third support body according to an embodiment of the application.

Please refer to FIG. 6 in conjunction with FIG. 5. FIG. 6 is a schematic structural plan view of the second support body 2 and the third support body 3 according to an embodiment of the application. As shown in FIG. 6, the third support body 53 includes two opposite positioning strips 531 and a plurality of support strips 532 connected between the two positioning strips 531. Specifically, the two positioning strips 531 are arranged corresponding to edges of the flexible display panel 5 in a longitudinal direction, a range between the two positioning strips 531 covers a distribution range of the ribs 22 of the second support 2. Referring to FIG. 5, the third support body 53 defines a support range 530, and the support strips 532 are spaced apart from each other and arranged in the support range 530. The support range 530 has a length L1, which is a sum of the sliding distance S1 and half of a circumference of the roller 42, so that all the support strips 532 are positioned on the ribs 22 of the second support body 2 in the expanded state. As shown in FIG. 6, in the expanded state, the support strips 532 are located on the ribs 22 of the second support body 2 and overlap the ribs 22 to form a network structure.

Please continue referring to FIG. 6 in conjunction with FIG. 3 and FIG. 5. In this embodiment, each of the support strips 532 has a same width, but the present application is not limited thereto. It should be noted that the support strips 532 are spaced apart from each other and extend in a direction different from the ribs 22 of the second support body 2. That is, an extending direction of the support strips 532 and an extending direction of the slots 11 of the first support body 1 are also different. In other words, the third support body 53 and the second support body 2 form a superimposed network structure (as shown in FIG. 6), that is, the support strips 532 of the third support body 53 and the ribs 22 of the second support body 2 are alternately stacked to form the network structure. It should be noted that each of the support strips 532 is disposed at a predetermined angle with the rib 22 and the slot 11, wherein the predetermined angle is between 0° and 90°. In this embodiment, the support strips 532 are perpendicular to the ribs 22, that is, the support strips 532 traverse the gaps d0 among the adjacent ribs 22, respectively.

Figure 7:
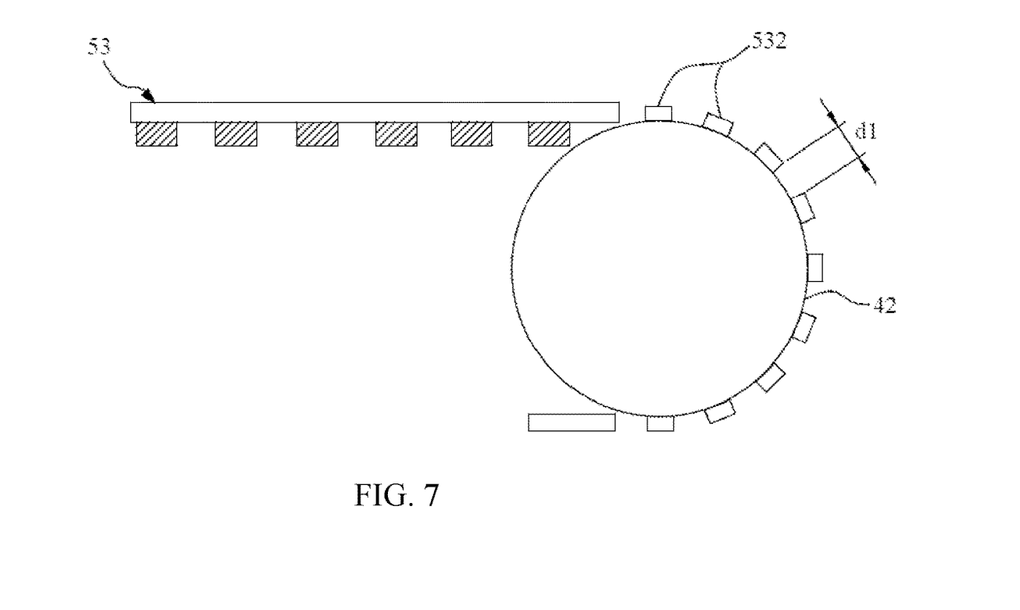
FIG. 7 is a schematic structural view of a third support body moving against a roller according to an embodiment of the present application.

Referring to FIG. 7 in conjunction with FIG. 6, FIG. 7 is a schematic structural view of the third support body 53 moving against the roller 42. As shown in FIG. 7, the support strips 532 of the third support body 53 move around and against the roller 42 during the switching between the unexpanded state and the expanded state. In addition, as shown in FIG. 6, the support strips 532 of the third support body 53 are spaced apart from each other. Specifically, a first distance d1 (as shown in FIG. 7) is defined between adjacent ones of the support strips 532. The first distance d1 is a difference between a pitch P2 defined from a side of any of the support strips away from an adjacent support strip to the adjacent support strip minus a width P1 of the any of the support strip (as shown in FIG. 6), wherein the difference is designed according to a radius of the flexible display panel 5, so that the adjacent support strips 532 do not interfere with each other. Specifically, the first distance d1 is greater than zero, so that the adjacent support strips 532 do not interfere with each other in the process of moving around and against the roller 42.

Figure 9:
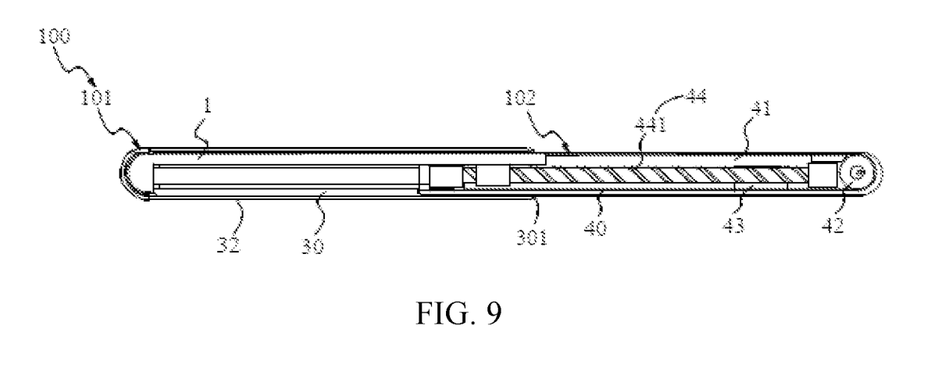
FIG. 9 is a schematic cross-sectional view of a slidable display device in the expanded state according to an embodiment of the present application.

Referring to FIGS. 8 and 9, which are schematic cross-sectional views of the slidable display device 100 in the unexpanded state and the expanded state, respectively, according to an embodiment of the present application, as shown in FIG. 8, part of the flexible display screen 102 is hidden between the bottom case 3 and the first support body 1 when the slidable display device 100 of the present application is in the unexpanded state. At this time, the screen support plate 43 is located in the accommodating space 30, and the screw rod modules 44 are not actuated. As shown in FIG. 9, when switching from the unexpanded state to the expanded state, the linkage mechanism 4 can be driven by the motor to rotate a screw rod 441 of each of the screw rod modules 44, and drive the actuating assembly 41 and the screen support plate 43 to move in the direction of the open end 301. At the same time, the flexible display screen 102 is bent along and against the roller 42, and the flexible display screen 102 hidden in the accommodating space 30 slides out of the accommodating space 30 from the open end 301; at this time, the screen support plate 43 is located outside the accommodating space 30, so that the size of the flexible display screen 102 becomes larger. Similarly, under user's control of the slidable display device 100 of the present application, the flexible display screen 102 can return to the unexpanded state in the opposite direction of switching to the expanded state, thereby reducing the size.

Particularly, based on the third support body 53 provided between the flexible display screen 102 and the housing assembly 101 of the slidable display device 100 of the present application, the superimposed network structure is created through the support strips 532 of the third support body 53 which are staggered from and stacked on the ribs 22 of the second support body 2 and the slots 11 of the first support body 1. Specifically, the gaps formed by the comb-like configuration of the first support body 1 and the second support body 2 are divided due to the network structure, thereby minimizing an unsupported area of the flexible display screen 102 and ensuring that the flexible display screen 102 is fully supported, so that sinking in the gaps during user's touch pressing will not occur, thereby preventing damage to the flexible display screen.

Figure 10A:
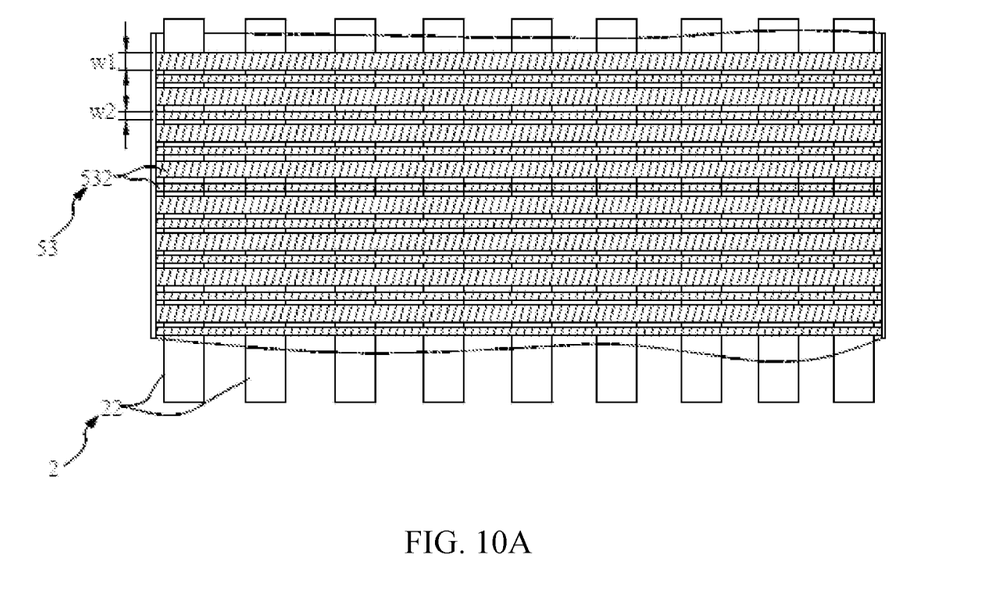
FIG. 10A is a schematic structural view of a third support body according to another embodiment of the present application.

Refer to FIG. 10A, it is a schematic structural view of a third support body according to another embodiment of the present application. The difference between this embodiment and the foregoing embodiment lies in that some of each of the support strips 532 of the third support body 53 has a first strip width w1, some of each of the support strips 532 has a second strip width w2, and the second strip width w2 is less than or greater than the first strip width w1. In this embodiment, the second strip width w2 is less than the first strip width w1. The arrangement of the support strips 532 with different support strip widths can form a tighter network structure and improve the support effect.

Figure 10B:
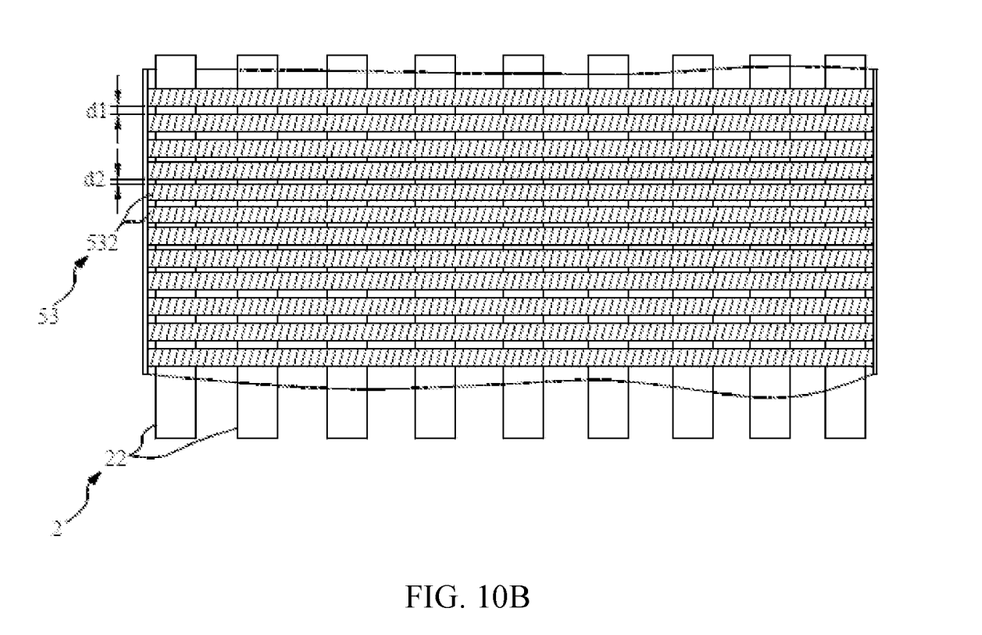
FIG. 10B is a schematic structural view of a third support body according to another embodiment of the present application.

Refer to FIG. 10B, it is a schematic structural view of a third support body according to another embodiment of the present application. The difference between this embodiment and the foregoing embodiments is that a second distance d2 is defined between adjacent ones of some of the support strips 532 of the third support body 53, and the second distance d2 is less or greater than the first distance d1. In this embodiment, the second distance d2 is less than the first distance d1. According to an area where the flexible display screen 102 is often touched and pressed, in the present application, more support strips 532 can be arranged at the second distance d2 to further form a tighter network structure and improve the support effect.

Figure 10C:
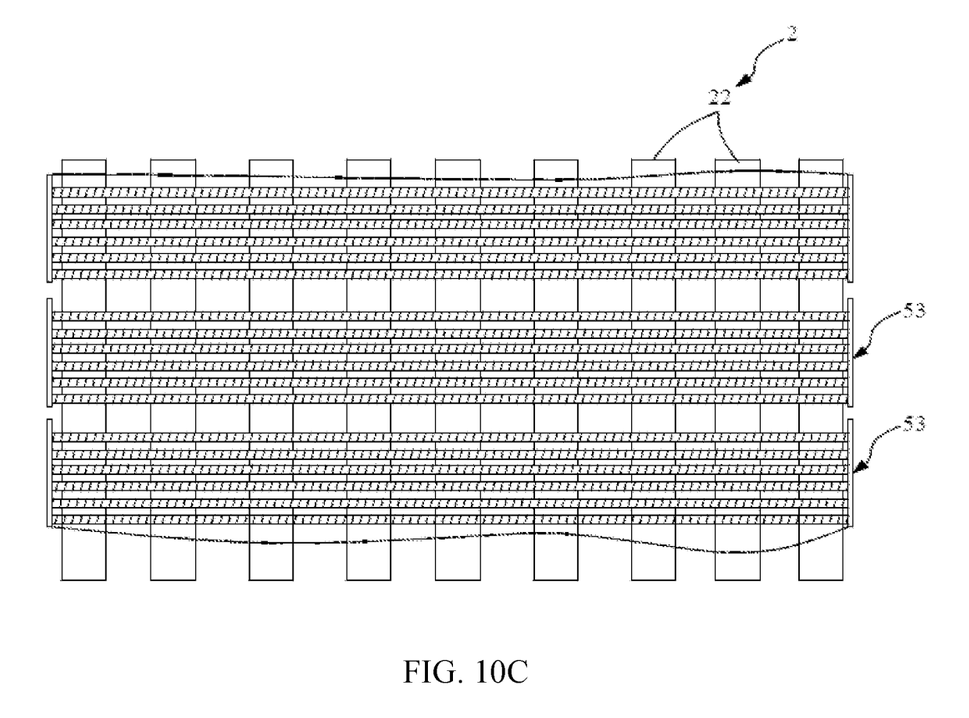
FIG. 10C is a schematic structural view of a third support body according to another embodiment of the present application.

Refer to FIG. 10C, it is a schematic structural view of a third support body according to another embodiment of the present application. The difference between this embodiment and the foregoing embodiment is that the flexible display screen 102 includes a plurality of the third support bodies 53. That is, the third support bodies 53 are configured separately. The plurality of third support bodies 53 may be arranged adjacently and spliced to form a whole piece of support structure. The support structure formed by the third support bodies 53 configured with multiple parts spliced together can disperse the force of touch pressing, thereby improving the support effect.

Accordingly, the embodiment of the present application provides the slidable display device, which can achieve the display mode in the expanded state by sliding, thereby increasing a display and touch area, and providing different usage patterns; alternatively, the display mode can be switched from the expanded state to the unexpanded state by sliding, so that the size of the slidable display device can be reduced for convenient carrying. In addition, based on the third support body provided between the flexible display screen and the housing assembly of the slidable display device of the present application, the network structure is created through the support strips of the third support body which are staggered from and stacked on the ribs of the second support body and the slots of the first support body. The gaps formed by the comb-like configuration of the first support body and the second support body are divided due to the network structure, thereby minimizing an unsupported area of the flexible display screen and ensuring that the flexible display screen is fully supported, so that sinking in the gaps during user's touch pressing will not occur, thereby preventing damage to the flexible display screen. Furthermore, the present application uses the adhesive layer in combination with the third support body to make the flexible display screen have better temperature and weather resistance. In this fashion, the performance changes in different use environments are small, the module stack has low rebound force at low temperatures, and the push and pull force of the motor driving the sliding is smaller that can ensure that the attachment between the support strips of the third support body and the adhesive layer will not shift due to sliding. Through the above-mentioned structure, the slidable display device of the present application has a better display appearance and can solve the problems in traditional display devices with scrolling screens, such as sinking in a touch area, poor weather resistance, and material creep under pretension, resulting in the appearance of wrinkles or creases, thereby causing damage.

In the above-mentioned embodiments, the description of each embodiment has its own emphasis. For parts that are not described in detail in an embodiment, reference may be made to related descriptions of other embodiments.

The above describes the embodiments of the present application in detail. The descriptions of the above embodiments are only used to help understand the technical solutions and kernel ideas of the present disclosure; those of ordinary skill in the art should understand that they can still modify the technical solutions described in the foregoing embodiments, whereas these modifications or substitutions do not deviate the essence of the corresponding technical solutions from the scope of the technical solutions of the embodiments of the present disclosure.

What is claimed is:

1. A slidable display device, providing display modes in an unexpanded state and in an expanded state, and comprising: a housing assembly comprising a bottom case, and a first support body, a second support body, and a linkage mechanism which are disposed on the bottom case, wherein the second support body is connected to the linkage mechanism, and the linkage mechanism is configured to drive the second support body to slide out of the bottom case into the expanded state or slide into the bottom case into the unexpanded state; and the flexible display screen supported on the first support body and the second support body, and part of the flexible display screen hidden between the bottom case and the first support body in the unexpanded state, wherein the flexible display screen comprises: a flexible display panel; a backplate disposed on a side of the flexible display panel facing the housing assembly; an adhesive layer disposed on a side of the backplate facing the housing assembly; and
  at least a third support body disposed on a side of the adhesive layer opposing to the backplate and facing the housing assembly, and at least a network structure is collectively defined by the third support body and the second support body; and a metal tape attached to a side of the third support body adjacent to two opposite positioning strips of the third support body and covering the third support body; wherein the first support body comprises a plurality of slots arranged at intervals, the second support body comprises a plurality of ribs arranged at intervals, and the ribs are slidably and correspondingly insertable to the slots, wherein the third support body comprises a plurality of support strips connected between the two positioning strips and spaced apart from each other and extending in a direction different from the ribs, and the two positioning strips are arranged corresponding to edges of the flexible display panel in a longitudinal direction and the support strips at least overlap with the ribs in the expanded state such that the support strips are staggered from the ribs for formation of the network structure; and the linkage mechanism comprises an actuating assembly, a roller disposed at one end of the actuating assembly, and a screen support plate disposed under the roller, wherein the flexible display screen is arranged around the roller, one end of the flexible display screen is fixed to the screen support plate, and the other end is fixed to an end of the first support body away from the roller, wherein the support strips move around and against the roller during a switching between the unexpanded state and the expanded state, and a first distance is defined between adjacent ones of the support strips, so that the adjacent support strips do not interfere with each other in a process of moving around and against the roller.

2. The slidable display device of claim 1, wherein the slots of the first support body define a sliding distance, and the ribs of the second support body slide the sliding distance relative to the slots, wherein the third support body defines a support range, the support strips are arranged in the support range, and a length of the support range is a sum of the sliding distance and half of a circumference of the roller.

3. The slidable display device of claim 1, wherein a first distance is defined between adjacent ones of some of the support strips, a second distance is defined between adjacent ones of some of the support strips, and the second distance is less or greater than the first distance.

4. The slidable display device of claim 1, wherein some of each of the support strips has a first strip width, some of each of the support strips has a second strip width, and the second strip width is less than or greater than the first strip width.

5. The slidable display device of claim 1, wherein the support strip is disposed at a predetermined angle with the rib and the slot, wherein the predetermined angle is between 0° and 90°.

6. The slidable display device of claim 1, wherein the flexible display screen comprises a plurality of the third support bodies, and the third support bodies are arranged adjacent to each other.

7. A slidable display device, providing display modes in an unexpanded state and in an expanded state, and comprising: a housing assembly comprising a bottom case, and a first support body, a second support body, and a linkage mechanism disposed on the bottom case, wherein the second support body is connected to the linkage mechanism, and the linkage mechanism is configured to drive the second support body to slide out of the bottom case into the expanded state or slide into the bottom case into the unexpanded state; and the flexible display screen supported on the first support body and the second support body, and part of the flexible display screen hidden between the bottom case and the first support body in the unexpanded state, wherein the flexible display screen comprises: a flexible display panel; a backplate disposed on a side of the flexible display panel facing the housing assembly; an adhesive layer disposed on a side of the backplate facing the housing assembly;

at least a third support body disposed on a side of the adhesive layer opposing to the backplate and facing the housing assembly, and at least a network structure is collectively defined by the third support body and the second support body; and a metal tape attached to a side of the third support body adjacent to two opposite positioning strips of the third support body and covering the third support body; wherein the first support body comprises a plurality of slots arranged at intervals, the second support body comprises a plurality of ribs arranged at intervals, and the ribs are slidably and correspondingly insertable to the slots, wherein the third support body comprises a plurality of support strips connected between the two positioning strips and spaced apart from each other and extending in a direction different from the ribs, and the two positioning strips are arranged corresponding to edges of the flexible display panel in a longitudinal direction and the support strips at least overlap with the ribs in the expanded state such that the support strips are staggered from the ribs for formation of the network structure; and the linkage mechanism comprises an actuating assembly, a roller disposed at one end of the actuating assembly, and a screen support plate disposed under the roller, wherein the flexible display screen is arranged around the roller, one end of the flexible display screen is fixed to the screen support plate, and the other end is fixed to an end of the first support body away from the roller, wherein the support strips move around and against the roller during a switching between the unexpanded state and the expanded state, and a first distance is defined between adjacent ones of the support strips, so that the adjacent support strips do not interfere with each other in a process of moving around and against the roller.

8. The slidable display device of claim 7, wherein the slots of the first support body define a sliding distance, and the ribs of the second support body slide the sliding distance relative to the slots, wherein the third support body defines a support range, the support strips are arranged in the support range, and a length of the support range is a sum of the sliding distance and half of a circumference of the roller.

9. The slidable display device of claim 7, wherein a first distance is defined between adjacent ones of some of the support strips, a second distance is defined between adjacent ones of some of the support strips, and the second distance is less or greater than the first distance.

10. The slidable display device of claim 7, wherein some of each of the support strips has a first strip width, some of each of the support strips has a second strip width, and the second strip width is less than or greater than the first strip width.

11. The slidable display device of claim 7, wherein the support strip is disposed at a predetermined angle with the rib and the slot, wherein the predetermined angle is between 0° and 90°.

12. The slidable display device of claim 7, wherein the flexible display screen comprises a plurality of the third support bodies, and the third support bodies are arranged adjacent to each other.

13. The slidable display device of claim 7, wherein the third support body is made of a rigid material, and the adhesive layer is a double-sided tape, a double-sided tape with adhesive material, or an optical adhesive.

* * * * *